United States Patent
Leung et al.

(10) Patent No.: US 6,452,778 B1
(45) Date of Patent: Sep. 17, 2002

(54) PARASITIC INSENSITIVE CAPACITOR IN D/A CONVERTER

(75) Inventors: Ka Y. Leung, Austin; Michael S. Enoch, Pflugerville, both of TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

(21) Appl. No.: 09/596,785

(22) Filed: Jun. 19, 2000

(51) Int. Cl.$^7$ .......................... H01G 4/228; H01G 4/20
(52) U.S. Cl. ..................... 361/306.3; 361/312; 361/303
(58) Field of Search ........................... 361/301.1, 301.4, 361/303–305, 306.1–306.3, 311–313, 320, 321.1–321.5, 328, 329, 330; 257/306, 307

(56) References Cited

U.S. PATENT DOCUMENTS

| | | | |
|---|---|---|---|
| 4,338,591 A | 7/1982 | Tuthill | 340/347 |
| 5,220,483 A | 6/1993 | Scott | 361/313 |
| 5,343,199 A | 8/1994 | Sugawa | 341/159 |
| 5,581,252 A | 12/1996 | Thomas | 341/144 |
| 5,703,588 A | 12/1997 | Rivoir et al. | 341/159 |
| 6,066,537 A | * 5/2000 | Poh | 438/393 |
| 6,146,939 A | * 11/2000 | Dasgupta | 438/251 |

OTHER PUBLICATIONS

A Monolithic Charge–Balancing Successive Approximation A/D Technique, Thomas P. Redfern, Joseph J. Connolly, Jr., Sing W. Chin and Thomas M. Frederiksen, *IEEE J. Solid State Circuits*, vol. SC–14, pp. 912–920, Dec. 1979.

"High Resolution A/D Conversion in MOS/LSI"; Bahram Fotouhi and David A. Hodges; *IEEE J. Solid State Circuits*, vol. SC–14, pp. 920–926, Dec. 1979.

"Technological Design Considerations for Monolithic MOS Switched–Capacitor Filtering Systems", David J. Allstot and William C. Black, Jr., *Proc.IEEE*, vol. 71, pp. 967–968, Aug. 1983.

"Error Correction Techniques for High–Performance Differential A/D Converters", Khen–Sang Tan, Sami Kiriaki, Michiel De Wit, John W. Fattaruso, Ching–Yuh Tsay, W. Edward Matthews and Richard K. Hester; *IEEE J. Solid State Circuits*, vol. 25, No. 6, Dec. 1990.

"A 12–b 5–MSample/s Two–Step CMOS Converter", Behzad Razavi and Bruce A. Wooley, *IEEE J. Solid State Circuits*, vol. 27, Dec.1992.

"An IEEE 1451 Standard Transducer Interface Chip with 12–b ADC, Two 12–b DAC's, 10–kB Flash EEPROM and 8–b Microcontroller", Tim Cummins, Eamonn Byrne, Dara Brannick and Denis A. Dempsey, *IEEE J. Solid Circuits*, vol. 33, No. 12, Dec. 1998.

* cited by examiner

Primary Examiner—Anthony Dinkins
Assistant Examiner—Eric W. Thomas
(74) Attorney, Agent, or Firm—Howison, Thoma & Arnott, L.L.P.

(57) ABSTRACT

A parasitic insensitive capacitor in a D/A converter. A semiconductor substrate is provided having a first face upon which the semiconductor integrated circuit is formed with a first conductive layer disposed over a portion of the first face of the semiconductor substrate and separated therefrom by a first insulating layer to form the lower plate of the capacitor. A second conductive layer is disposed over a portion and less than all of the first conductive layer and separated therefrom by a second insulating layer to form the upper plate of the capacitor. A third conductive layer disposed above the first and second conductive layers and separated from the first conductive layer by a third insulating layer, the third conductive layer having an opening therein of substantially the same shape as the second conductive layer and wherein the peripheral edges of the opening are substantially aligned with the peripheral edges of the second conductive layer. A conductive interconnect is disposed above the third conductive layer and separated therefrom by a fourth insulating layer and connected on at least a portion thereof to the second conductive layer, the interconnect extending over the third conductive layer such that the third conductive layer separates the interconnect from the first conductive layer.

42 Claims, 5 Drawing Sheets

PARASITIC INSENSITIVE CAPACITOR IN D/A CONVERTER

BACKGROUND OF THE INVENTION

Switched capacitor structures typically utilize a plurality of capacitors having the plates thereof switched from the input of a differential amplifier to another voltage or to the output of the previous stage, which also incorporates the output of a differential amplifier. These capacitors are normally formed on an integrated circuit from a combination of semiconductor material, metal and oxide. Each capacitor is comprised of a plurality of layers, including the interconnect layers. However, the interconnect layers, depending upon the fabrication thereof, have associated therewith parasitic capacitance. This parasitic capacitance is a function of the layout, the thickness of the oxides, etc. This causes manufacturing variations between capacitors.

Typically, capacitors are fabricated based upon a "unit" value. For example, a unit capacitor may constitute one capacitor in a binary weighted string wherein the first capacitor in the string is a single unit value the second is comprised of two units, the third four units, etc. The way that the capacitors are manufactured is to actually fabricate unit capacitors and interconnect the capacitors together. However, the interconnection can have parasitics associated therewith which results in the capacitor being greater or less than a multiple of a unit value capacitor.

SUMMARY OF THE INVENTION

The present invention disclosed and claimed herein, in one aspect thereof, comprises a capacitor structure in a integrated circuit. A semiconductor substrate is provided having a first face upon which the semiconductor integrated circuit is formed with a first conductive layer disposed over a portion of the first face of the semiconductor substrate and separated therefrom by a first insulating layer to form the lower plate of the capacitor. A second conductive layer is disposed over a portion of and less than all of the first conductive layer and separated therefrom by a second insulating layer to form the upper plate of the capacitor. A third conductive layer is disposed above the first and second conducting layers and separated from the first conducting layer by a third insulating layer, the third conducting layer having an opening therein of substantially the same shape as the second conducting layer and wherein the peripheral edges of the opening are substantially aligned with the peripheral edges of the second conducting layer. A conductive interconnect is disposed above the third conductive layer and separated therefrom by a fourth insulating layer and connected on at least a portion thereof to the second conducting layer, the interconnect extending over the third conductive layer such that the third conductive layer separates the interconnect from the first conductive layer.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
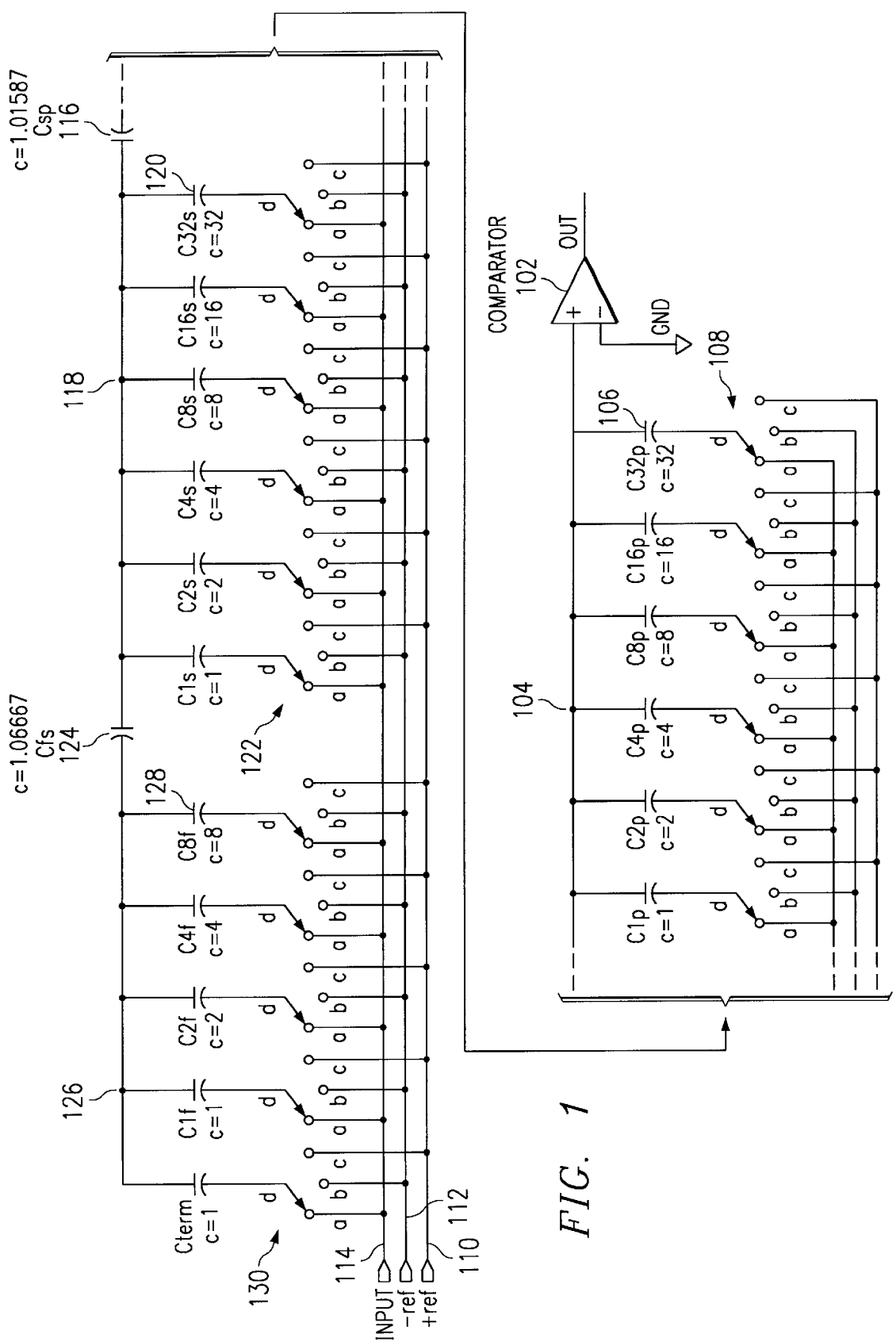
FIG. 1 illustrates a schematic drawing of a switched capacitor input to a comparator for use with a digital-to-analog converter.

Referring now to FIG. 1, there is illustrated a schematic diagram of a switched capacitor structure for input to a digital-to-analog converter coupled to a comparator 102 of a successive approximation type analog-to-digital converter. The comparator 102 has a positive input and a negative input, the negative input connected to ground. The positive input is connected to a first node 104, which node has a plurality of binary weighted capacitors 106, each connected thereto on one plate thereof. The other plate of each of the capacitors 106 is connected to a respective switch 108. The switch 108 is operable to selectively connect the other plate of the respective capacitor 106 to one of three nodes, a node 110 which is connected to a positive reference voltage, a node 112 which is connected a negative reference voltage, and a node 114 which is connected is an input analog voltage to be converted. The node 104 is connected through a capacitor 116 to a second capacitive node 118. Node 118 has a plurality of binary weighted capacitors 120, each with one plate thereof connected to node 118. The other plates of capacitors 120 are connected to respective switches 122, which switches 122 are operable to connect the other plate of the respective one of the capacitors 120 to one of the three nodes 110–114. Node 118 is also connected through a capacitor 124 to a node 126. Node 126 is connected to one plate of a plurality of binary weighted capacitors 128, the other plates of which are connected to a respective switch 130. The switch 130 for each of the respective capacitors 128 is operable to connect the other plate of the respective capacitor 128 to one of the nodes 110–114. This configuration illustrated in FIG. 1 is that of a charge scale digital-to-analog converter. It can be seen that the binary weighted capacitors vary from a unit, value to a value of 32X of the unit value in a binary manner.

Figure 2:
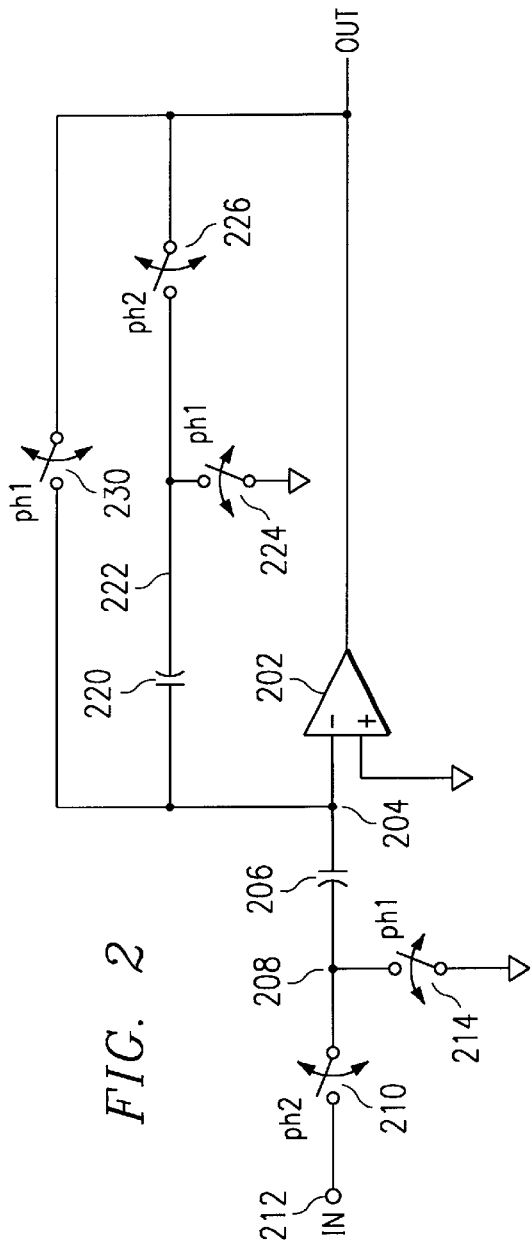
FIG. 2 illustrates a switched capacitor amplifier.

Referring now to FIG. 2, there is illustrated a schematic diagram of a switched capacitor amplifier. An amplifier 202 is provided having a positive input connected to ground and the negative input connected to a node 204. Node 204 is connected to one plate of a capacitor 206, the other plate thereof is connected to a node 208. Node 208 is connected to one side of a switch 210, the other side thereof connected to an input terminal 212. Also, node 208 is connected to one side of a switch 214, the other side thereof connected to ground. Switch 210 is controlled by phase of a two-phase clock, phase ph2 and switch 214 is controlled by the first phase two (ph2), ph1 of the two phase clock.

Node 204 is also connected in a feedback configuration with the output of amplifier 202. Node 204 is connected to one side of a capacitor 220, the other side thereof connected to a node 222. Node 222 is connected to one side of a switch 224, the other side thereof connected to ground. Switch 224 is controlled by the clock signal ph1. Node 222 is connected to one side of a switch 226, the other side thereof connected to the output node. Switch 226 controlled is by the clock signal ph2. In parallel with the capacitor 220 and switch 226 is a switch 230 having one side thereof connected to node 204 and the other side connected to the output node, and controlled by the ph1 clock signal.

Figure 3:
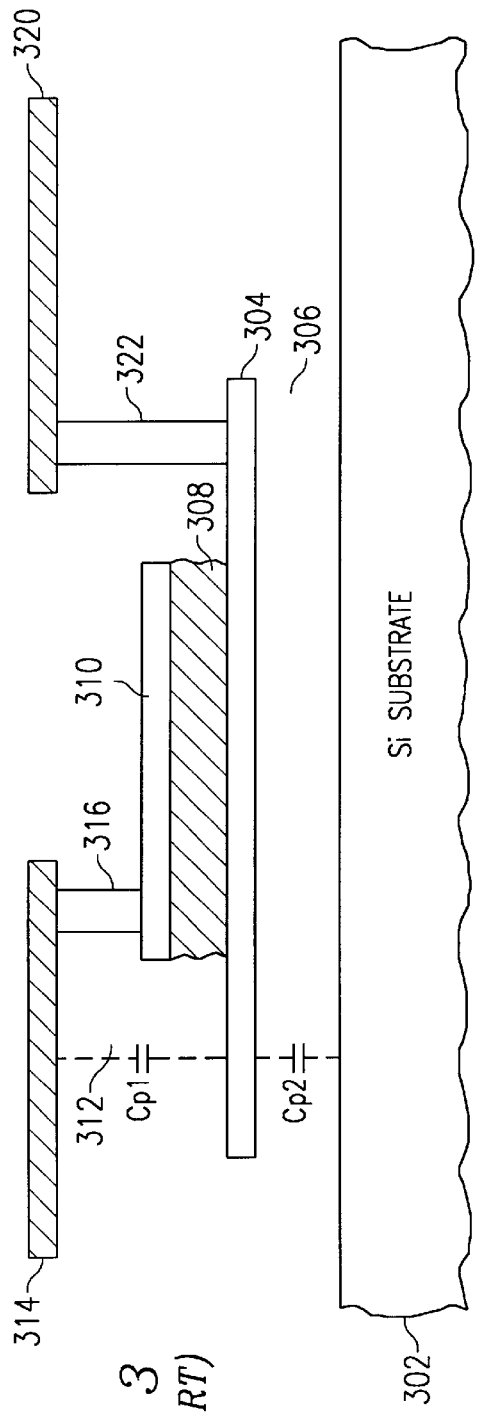
FIG. 3 illustrates a cross-sectional diagram of a capacitor layout for a prior art capacitor.

Referring now to FIG. 3, there is illustrated a cross-sectional diagram of a prior art capacitor structure for a unit value capacitor. The capacitor structure is fabricated on a silicon substrate 302 with a layer of polycrystalline silicon (poly) 304 disposed over the silicon substrate 302 and separated therefrom by a layer of oxide 306, this being silicon dioxide. This constitutes the lower plate of the capacitor. Typically, the poly layer 304 is formed by deposition techniques and then patterning thereof.

Once the lower plate 304 has been formed, a layer of thin oxide 308 is disposed over the plate 304 and then the upper plate of the capacitor formed from a deposited and patterned layer of poly 310. Thereafter, a layer of oxide 312 is disposed over the substrate and then a layer of metal disposed thereover. This layer of metal provides the interconnects. There is provided a first interconnect 314 separated from the upper plate 310 by the layer of oxide 312 for interconnecting thereto. This interconnect is through the use of a plug 316, for example, tungsten. This is typically formed by creating a via through the oxide layer 312, and then filling the via with tungsten 316. When the metal is formed over the layer of oxide 312, the metal will contact the tungsten plug 316.

Additionally, there is provided an interconnect 320 connected to the lower plate 304. This is formed by creating a via through the oxide layer and then filling the via with tungsten 322. The contact formed between metal layer 320 and bottom plate 304 is deeper than the contact formed between the metal layer 314 and the top plate 310. The top capacitor plate poly is acting as a stopper to prevent the etchng from extenting below the top plate 310.

Figure 4:
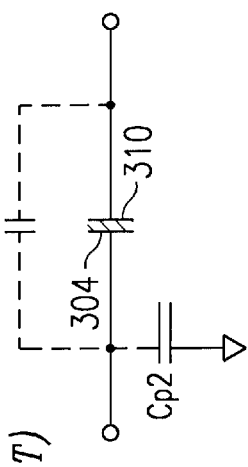
FIG. 4 illustrates schematically the capacitor of FIG. 3.

It can be seen that there will be a capacitance to the substrate from the lower capacitor plate 304, this labeled capacitor Cp2. There will also be a capacitance Cp1 between the interconnect 314 and the lower capacitor plate 304. It can be seen that this capacitor Cp1 is a capacitance that is disposed in parallel with the overall capacitor formed by the top capacitor plate 310, capacitor 308, dialectric and bottom capacitor plate 304. This is illustrated schematically is FIG. 4.

Figure 5:
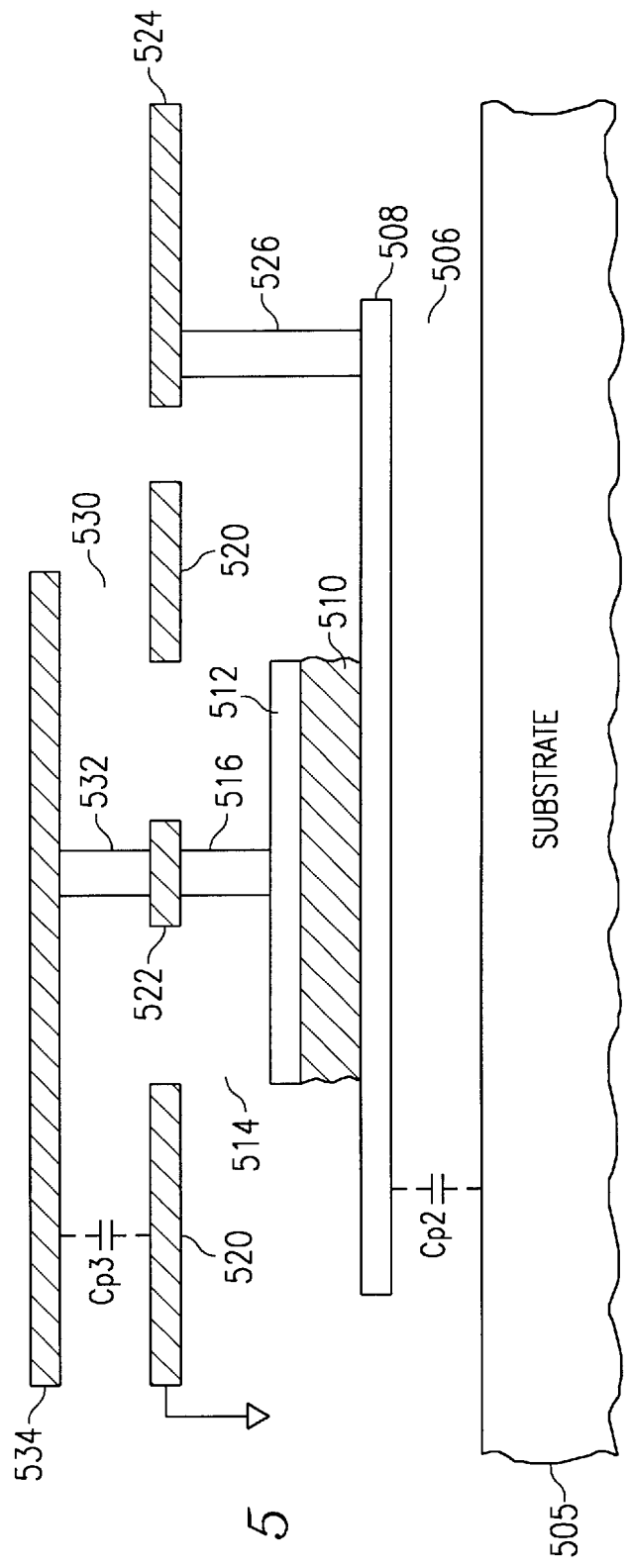
FIG. 5 illustrates a cross-sectional diagram of the capacitor of the present disclosure.

Referring now to FIG. 5, there is illustrated a cross-sectional view of the parasitic insensitive capacitor of the present disclosure. A silicon substrate 505 is provided which is slightly doped in accordance with conventional techniques. A layer of oxide 506 is then disposed over the substrate to a thickness of approximately 2900 Å. A layer of polycrystalline silicon is then formed over the substrate and patterned to form as the lower plate of the capacitor, a plate 508. This is typically formed with a thickness of approximately 2700 Å. A layer of thin oxide 510 is then formed over the lower capacitor plate 508 to a thickness of approximately 350 Å. This will be the thin oxide for the primary capacitor. A layer of polycrystalline silicon is then formed over the thin oxide layer 510 to a thickness of approximately 2750 Å. This is then patterned to form an upper plate 512 of a primary capacitor. A layer of oxide 514 is then disposed over the upper capacitor plate 512 to a thickness of approximately 5450 Å. A plug 516, for example tungsten, is then formed in a via within the oxide layer 514 and in contact with the upper capacitor plate 512 in approximately the center thereof, or in another suitable location. Thereafter, a layer of metal is deposited to a thickness of approximately 650 Å over the substrate and patterned. This layer of metal provides two functions, a shield function about the capacitor, as will be described hereinbelow, and an interconnect for the lower capacitor plate 508. The layer of metal over oxide 514 is patterned about the capacitor to form a shield 520 around the peripheral edge of the upper plate 512 of the capacitor. The edges of the shield 520 are formed slightly overlapping with the edges of the top capacitor plate 512. This is for the purpose of manufacturing tolerances. Additionally, there is a contact area 522 formed proximate to the plug 516. This is primarily to facilitate later processing for interconnecting to the top capacitor plate 512 from an upper layer.

In addition to the shield 520 and the contact area 522, an interconnect 524 is formed in the metal layer overlying the oxide layer 514. This will be connected to the bottom plate 508 of the capacitor through a plug 526. This is formed by creating a via through the oxide layer 514 and then filling the via with tungsten.

After formation and patterning of the metal layer overlying the oxide layer 514, an oxide layer 530 is deposited over the substrate to a thickness of approximately 10,000 Å. A via is formed in the oxide layer 530 above the contact region 522 and a plug 532 is disposed therein. Thereafter, a layer of metal is disposed over the oxide layer 530 to a thickness of approximately 6,000 Å and patterned to form an upper level contact 534. The metal is typically aluminum according to the present disclosure, although other metals could be used. Additionally, polycrystalline silicon can be utilized as an alternative.

Figure 6:
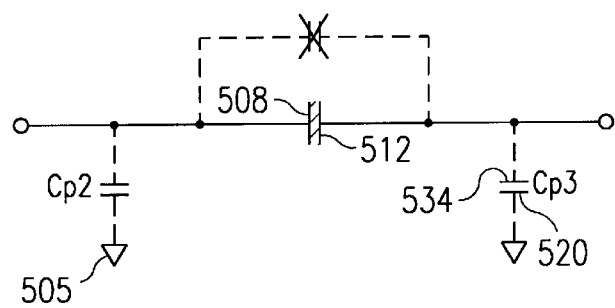
FIG. 6 illustrates a schematic diagram of the capacitor of FIG. 5.

The shield 520 is typically grounded or at the same potential as the substrate 505. There will inherently be formed a parasitic capacitor between the lower plate 508 of the capacitor and identified as the substrate, the capacitor Cp2. There will also be a parasitic capacitance Cp3 formed between the interconnect 534 and the shield 520. This is illustrated schematically in FIG. 6, it being seen that this capacitance Cp3 is from the interconnect to ground, or from one plate of the capacitor to ground, whereas the capacitor Cp2 is a parasitic capacitance between the other capacitor plate 508 and ground. There is virtually no parasitic capacitance in parallel with the primary capacitor.

Figure 7:
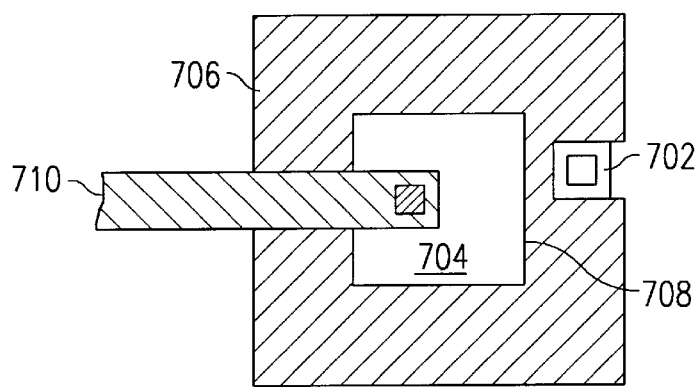
FIG. 7 illustrates a layout of a unit capacitor.

Referring now to FIG. 7, there is illustrated a top view of a layout for a single-unit capacitor. It can be seen that there is provided a lower plate 702 of the capacitor and an upper plate 704 for the capacitor. A shield layer of metal 706 is disposed around the peripheral edges of the capacitor. It can be seen that there is a peripheral edge 708 for the shield 706 that is substantially aligned with the peripheral edges of the upper capacitor plate 704. An interconnect 710 is formed from the upper metal layer that is formed above the shield layer 706.

Figure 8:
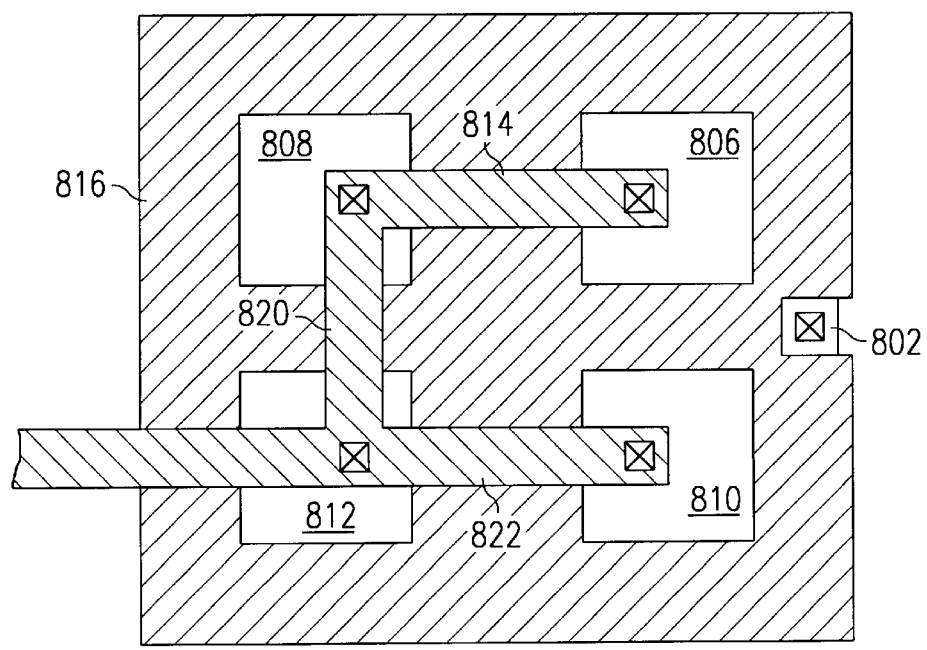
FIG. 8 illustrates a layout for a plurality of unit capacitors configured as a single capacitor.

Referring now to FIG. 8, there is illustrated a top view of four unit capacitors formed with the technique described hereinabove with reference to FIG. 7. In this embodiment, there are provided four capacitors, all having a common bottom plate 802. The upper plates of the capacitors are referred to by reference numerals 806, 808, 810 and 812. Each of these upper plates 806–812 are substantially the same size as the upper plate 704 of the unit capacitor value shown in FIG. 7. The capacitors 806 and 808 have an interconnect 814 disposed between the center regions of each of the upper plates 806 and 808. It can be seen that there will be a portion of this interconnect that overlies the bottom plate 802 between the two plates 806 and 808, although this region is shielded from the bottom plate by a shield layer 816 disposed between the interconnect 814 and the bottom plate 802. There is a portion 820 that interconnects upper plate 808 and upper plate 812, and a portion 822 that interconnects upper plate 810 and upper plate 812. It can be seen that the interconnection of the capacitors can result in different interconnects that would result in varying portions or amount of square surface area of interconnect that would overlie the bottom plate 802 for the binary weighted capacitors of respective valves 2, 4, 8, 16 or 32. Therefore, the actual multiple of the capacitance values would not necessarily be exact if the shield plate 816 were not utilized.

Figure 9:
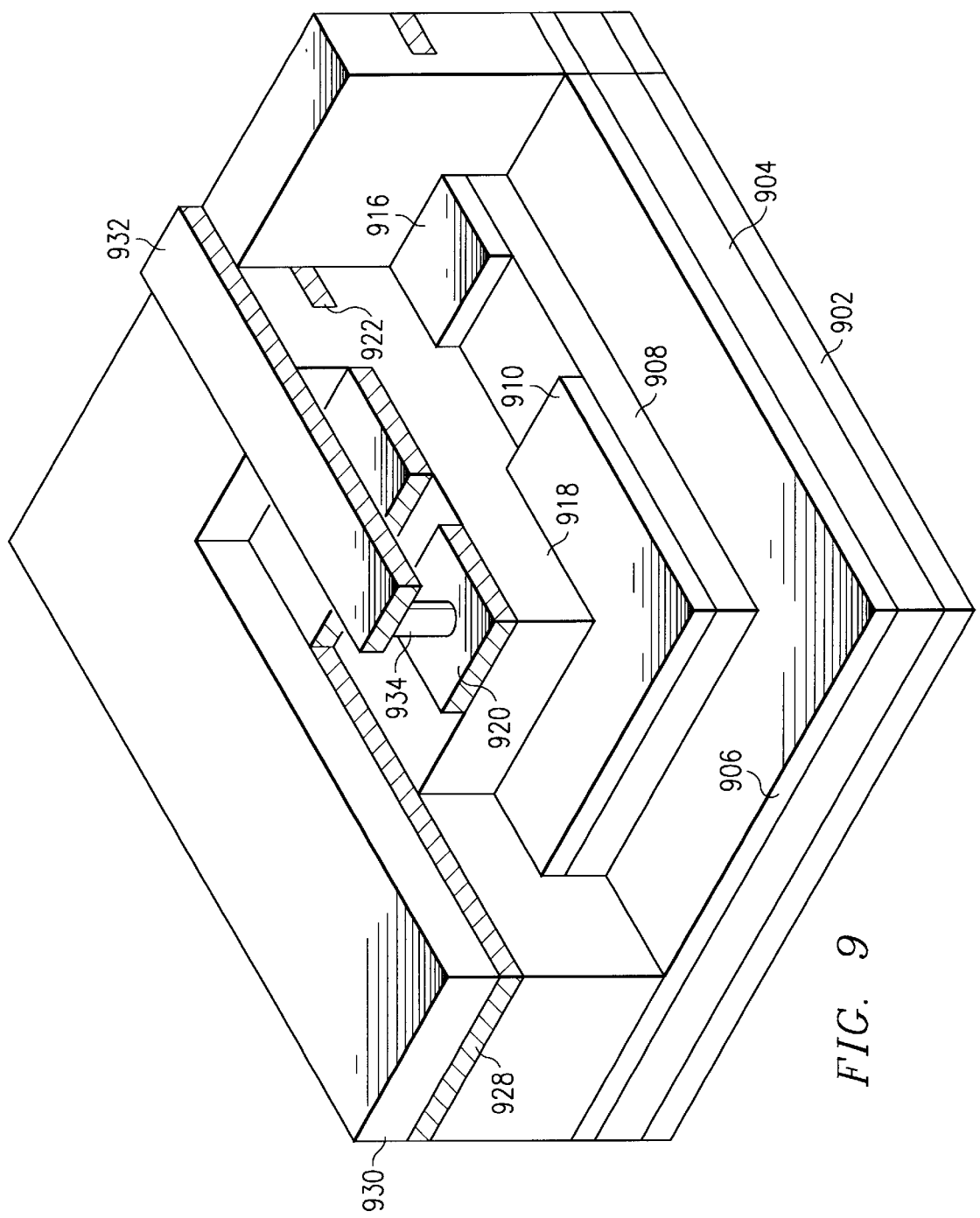
FIG. 9 illustrates a cut-away perspective view of a portion of the capacitor structure of FIG. 8.

Referring now to FIG. 9, there is illustrated a perspective view of two 2-unit capacitors in a cutaway view. There is provided a silicon substrate 902 over which a layer of oxide 904 is formed. A bottom plate 906 is formed from poly over which is disposed a layer of thin oxide 908. There are provided two upper plates 910 and 916 disposed on the upper surface of the oxide layer 908. The upper plates 910 and 916 have a layer of oxide 918 disposed thereover with a plug (not shown) formed therethrough to a contact region 920 for upper plate 910 and a contact region 922 for the upper plate 916. In the same metal layer as region 920, there is formed a shield layer 928 of metal which is disposed such that it does not extend or substantially overlap the peripheral edges of the upper plate 910. A layer of oxide 930 is disposed over shield plate 928 and an interconnect 932 is formed on the upper surface thereof to interconnect to the upper contact regions 920 and 922, the connection for region 920 illustrated as being connected with a conductive plug 934.

In summary, there has been provided a parasitic insensitive capacitor which is realized with the use of a shielding plate between the upper interconnect layer and the lower plate of the capacitor.

Although the preferred embodiment has been described in detail, it should be understood that various changes, substitutions and alterations can be made therein without departing from the spirit and scope of the invention as defined by the appended claims.

What is claimed is:

1. A capacitor structure in at integrated circuit, comprising:
   a semiconductor substrate having a first face upon which the integrated circuit is formed;
   a first conductive layer disposed over a portion of the first face of said semiconductor substrate and separated therefrom by a first insulating layer to form a lower plate of a capacitor;
   a second conductive layer disposed over at least a portion of said first conductive layer and sparated therefrom by a second insulating layer to form the upper plate of the capacitor;
   a third conductive layer disposed about said first and second conductive layers and separated from said first conductive layer by a third insulating layer, said third conductive layer having an opening therein of substantially the same shape as said second conductive layer and wherein the peripheral edges of said opening are substantially aligned with the peripheral edges of said second conductive layer; and
   a conductive interconnect disposed above said third conductive layer and separated therefrom by a fourth insulating layer and connected on at least a portion thereof to said second conductive layer, said interconnect extending over said third conductive layer such that said third conductive layer separates said interconnect from said first conductive layer.

2. The capacitor structure of claim 1, and further comprising a fourth conductive layer disposed over said first conductor layer and separated therefrom by a fifth layer of insulating material and connected through said fifth layer of insulating material to contact said first conductive layer to provide a potential thereto.

3. The capacitor structure of claim 2, wherein said fourth conductive layer is formed of the same material and at the same level as said third conductive layer.

4. The capacitor structure of claim 1, wherein said second insulating layer comprises a thin oxide layer.

5. The capacitor structure of claim 1, wherein said first insulating layer comprises a silicon dioxide material.

6. The capacitor structure of claim 1, wherein said third conductive layer is disposed at substantially the same voltage potential as said substrate.

7. The capacitor structure of claim 1, wherein said first conductive layer is comprised of a silicon-based material.

8. The capacitor structure of claim 1, wherein said first conductive layer is comprised of polycrystalline silicon.

9. The capacitor structure of claim 8, wherein said second conductive layer is comprised of polycrystalline silicon.

10. The capacitor structure of claim 1, wherein said third conductive layer is comprised of a metal layer.

11. The capacitor structure of claim 1, wherein at least one of the peripheral edges of said first and conductive layer extends beyond at least a portion of the edge of said opening in said third conductive layer.

12. A capacitor structure in an integrated circuit, comprising:
    a semiconductor substrate having a first face upon which the integrated circuit is formed;
    a first conductive layer disposed over a portion of the first face of said semiconductor substrate and separated therefrom by a first insulating layer to form the lower plate of at lest two capacitors;
    at least two second conductive layers disposed over at least a portion of said first conductive layer and separated therefrom by a second insulating layer to form an upper plate of at least two capacitors;
    a third conductive layer disposed above said first conductive layer and said at least two second conductive layer and separated from said first conductive layer by a third insulating layer, said third conductive layer having at least two openings, each opening associated with a respective said second conductive layer, and each said opening having substantially the same shape as the repective said second conductive layer, and wherein the peripheral edges of said openings are substantially aligned with the peripheral edges of the respective said second conductive layer; and
    a conductive interconnect disposed above said third conductive layer and separated therefrom by a fourth insulating layer, said conductive interconnect connected to each of said at least two second conductive layers, conductive interconnect extending over said third conductive layer such that said third conductive layer separates said conductive interconnect from said first conductive layer.

13. The capacitor structure of claim 12, and further comprising a fourth conductive layer disposed over a first conductive layer and separated therefrom by a fifth layer of insulating material, said fourth conductive layer connected through said fifth layer of insulating material to contact said first conductive layer to provide a potential thereto.

14. The capacitor structure of claim 13, wherein said fourth conductive layer is formed of the same material and at the same level as said third conductive layer.

15. The capacitor structure of claim 12, wherein said second insulating layer comprises a thin oxide layer.

16. The capacitor structure of claim 12, wherein said first insulating layer comprises a silicon dioxide layer.

17. The capacitor structure of claim 12, wherein said third conductive layer is disposed at substantially the same voltage potential as said substrate.

18. The capacitor structure of claim 12, wherein said first conductive layer is comprised of polycrystalline silicon.

19. The capacitor structure of claim 12, wherein said first conductive layer is comprised of polycrystalline silicon.

20. The capacitor structure of claim 19, wherein said at lest two second conductive layers are each comprised of polycrystalline silicon.

21. The capacitor structure of claim 12, wherein said third conductive layer is comprised of metal layer.

22. The capacitor structure of claim 12, wherein said at least one of the periperal edges of said third conductive layer extends beyond at least a portion of one of said openings.

23. A method for forming a capacitor structure in an integrated circuit, comprising the steps of:
    providing a semiconductor substrate having a first face upon which the integrated circuit is formed;
    disposing a first conductive layer over a portion of the first face of the semiconductor substrate and separated therefrom by a first insulating layer to from a lower plate of a capacitor;
    disposing a second conductive layer over at least a portion of the first conductive layer and separated therefrom by a second insulating layer to form the upper plate of the capaacitor,
    disposing a third conductive layer above the first and second conductive layers and separated from the first conductive layer by a third insulating layer, the third conductive layer having an opening therein of substantially the same shape as the second conductive layer and wherein the periperal edges of the opening are substantially aligned with the peripheral edges of the second conductive layer, and
    disposing a conductive interconnect above the third conductive layer and separated therefrom by a fourth insulating layer and connected on at least a portion thereof to the second conductive layer, the interconnect extending over the third conductive layer such that the conductive layer separates the interconnect from the first conductive layer.

24. The method of claim 23, and further comprising the step of disposing a fourth conductive layer over the first conductor layer and separated therefrom by a fifth layer or insulating material and connected through the fifth layer of insulating material to contact the first conductive layer provide a potential thereto.

25. The method of claim 24, wherein the fourth conductive layer is formed of the same material and the same level as the third conductive layer.

26. The method of claim 23, wherein the second insulating layer comprises a thin oxide layer.

27. The method of claim 23, wherein the first insulating layer comprises a silicon dioxide.

28. The method of claim 23, wherein the third conductive layer is disposed at substantially the same voltage potential as the substrate.

29. The method of claim 23, wherein the first conductive layer is comprised of a silicon-based material.

30. The method of claim 23, wherein the first conductive layer is comprised of polycrystalline silicon.

31. The method of claim 30, wherein the conductive layer is comprised of polycrystalline silicone.

32. The method of claim 23, wherein the third conductive layer is comprised of a metal layer.

33. A method for forming a capacitor structure in a integrated circuit, comprising the step of:
    providing a semiconductor substrate having a first face upon which the integrated circuit is formed;
    disposing a first conductive layer over a portion of the first face of the semiconductor substrate and separated therefrom by a first insulating layer to form the lower plate of at least two capacitors;
    disposing at least two second conductive layers over at least a portion of the first conductive layer and separated therefrom by a second insulating layer to form an upper plate of the at least two capacitors;
    disposing a third conductive layer above the first conductive layer and the at least two second conductive layers and separated form the first conductive layer by a third insulating layer, the third conductive layer having at least two openings, each opening associated with a respective second conductive layer, and each opening having substantially the same shape as the respective second conductive layer, and wherein the peripheral edges of the openings are substantially aligned with the peripheral edges of the respective second conductive layers, and
    disposing a conductive interconnect above the third conductive layer and separated therefrom by a fourth insulating layer, the conductive interconnect connected to each of the at least two second conductive layers, the conductive interconnect extending over the third conductive layer such that the third conductive layer separates the conductive interconnect from the first conductive layer.

34. The method of claim 33, and further comprising the step of disposing a fourth conductive layer over the first conductor layer and separated therefrom by a fifth layer of insulating material and connected through the fifth layer of insulating material to contact the first conductive layer to provide a potential thereto.

35. The method of claim 34, wherein the fourth conductive layer is formed of the same material and at the same level as the third conductive layer.

36. The method of claim 33, wherein the at least two second insulating layer each comprise a thin oxide layer.

37. The method of claim 33, wherein the first insulating layer comprises a silicon dioxide layer.

38. The method of claim 33, wherein the third conductive layer is disposed at substantially the same voltage potential as the substrate.

39. The method of claim 33, wherein the first conductive layer is comprised of a silicon-based material.

40. The method of claim 33, wherein the first conductive layer is comprised of polycrystalline silicon.

41. The method of claim 40, wherein the at least two second conductive layers are each comprised of polycrystalline silicon.

42. The method of claim 33, wherein the third conductive layer is comprised of a metal layer.

* * * * *